United States Patent
Li et al.

(10) Patent No.: US 10,574,260 B2
(45) Date of Patent: Feb. 25, 2020

(54) TECHNIQUES FOR FLOATING-POINT NUMBER CONVERSION

(71) Applicant: Cambricon Technologies Corporation Limited, Beijing (CN)

(72) Inventors: Zhen Li, Beijing (CN); Shaoli Liu, Beijing (CN); Tianshi Chen, Beijing (CN); Yunji Chen, Beijing (CN)

(73) Assignee: CAMBRICON TECHNOLOGIES CORPORATION LIMITED, Beijing (CN)

( * ) Notice: Subject to any disclaimer, the term of this patent is extended or adjusted under 35 U.S.C. 154(b) by 39 days.

(21) Appl. No.: 15/974,807

(22) Filed: May 9, 2018

(65) Prior Publication Data

US 2018/0262205 A1    Sep. 13, 2018

Related U.S. Application Data

(63) Continuation-in-part of application No. PCT/CN2016/078508, filed on Jan. 20, 2016.

(30) Foreign Application Priority Data

Jan. 20, 2016    (CN) .......................... 2016 1 0038994

(51) Int. Cl.
*G06F 5/01*    (2006.01)
*H03M 7/24*    (2006.01)
(Continued)

(52) U.S. Cl.
CPC ............ *H03M 7/24* (2013.01); *G06F 7/4833* (2013.01); *G06F 7/57* (2013.01); *G06F 9/30025* (2013.01)

(58) Field of Classification Search
None
See application file for complete search history.

(56) References Cited

U.S. PATENT DOCUMENTS 4,617,641 A * 10/1986 Hamada .................... G06F 7/48
                                                                341/95
5,805,486 A *  9/1998 Sharangpani ....... G06F 9/30032
                                                                708/495
(Continued)

FOREIGN PATENT DOCUMENTS

CN           1629798 A      6/2005
CN         102597948 A      7/2012

OTHER PUBLICATIONS

T. Chen, et al., "A Small-Footprint Accelerator for Large-Scale Neural Networks", ACM Transactions on Computer Systems, vol. 33, No. 2, Article 6, May 2015, 27 pages.
(Continued)

*Primary Examiner* — David H Malzahn
(74) *Attorney, Agent, or Firm* — Getech Law LLC; Jun Ye

(57) ABSTRACT

Aspects for converting floating-point numbers in a processor are described herein. As an example, the aspects may include receiving, by a floating-point number converter, an exponent bit length, a base value, and one or more first floating-point numbers of a first bit length. Further, the aspects may include calculating, by the floating-point number converter, one or more second floating-point numbers of a second bit length based on the exponent bit length and the base value, the one or more second floating-point numbers respectively corresponding to the one or more first floating-point numbers.

26 Claims, 6 Drawing Sheets

(51) Int. Cl.
*G06F 7/57* (2006.01)
*G06F 7/483* (2006.01)
*G06F 9/30* (2018.01)

(56) References Cited

U.S. PATENT DOCUMENTS

| | | | | |
|---|---|---|---|---|
| 2007/0258641 | A1* | 11/2007 | Srinivasan | H03M 7/24 382/166 |
| 2010/0095099 | A1 | 4/2010 | Boersma et al. | |
| 2011/0099295 | A1* | 4/2011 | Wegener | H03M 7/24 709/247 |
| 2012/0215822 | A1 | 8/2012 | Nystad et al. | |
| 2012/0242848 | A1* | 9/2012 | Hirayama | H03M 7/24 348/208.6 |
| 2018/0262205 | A1* | 9/2018 | Li | G06F 7/4833 |
| 2018/0322607 | A1* | 11/2018 | Mellempudi | G06F 7/5443 |
| 2018/0330239 | A1* | 11/2018 | Chen | G06N 3/00 |

OTHER PUBLICATIONS

Z. Du, et al., "An Accelerator for High Efficient Vision Processing", IEEE Transactions on Computer-aided Design of Integrated Circuits and System, vol. 36, No. 2, Feb. 2017, pp. 227-240.
S. Liu, et al., "Cambricon: An Instruction Set Architecture for Neural Networks", 2016 ACM/IEEE 43rd Annual International Symposium on Computer Architecture, Oct. 12, 2016, pp. 393-405.
S. Zhang, et al., "Cambricon-X" An Accelerator for Sparse Neural Networks, The 49th Annual IEEE/ACM International Symposium on Microarchitecture Article No. 20, Oct. 15, 2016, 12 pages.
Y. Chen, et al., "DaDianNao: A Machine-Learning Supercomputer", 2014 47th Annual IEEE/ACM International Symposium on Microarchitecture, Dec. 13, 2014, pp. 609-622.
T. Luo, et al., "DaDianNao: A Neural Network Supercomputer", IEEE Transaction on Computers, vol. 66, No. 1, Jan. 2017, pp. 73-88.
T. Chen, et al., "DianNao: A Small-Footprint High-Throughput Accelerator for Ubiquitous Machine-Learning", ASPLOS 14, Proceedings of the 19th international conference on Architectural support for programming languages and operating systems, Feb. 24, 2014, pp. 269-283.
Y. Chen, et al., "DianNao Family: Energy-Efficient Hardware Accelerators for Machine Learning", Communications of the ACM, vol. 59, No. 11, Nov. 2016, pp. 105-112.
D. Liu, et al., "PuDianNao: A Polyvalent Machine Learning Accelerator", ASPLOS '15 Proceedings of the Twentieth International Conference on Architectural Support for Programming Languages and Operating Systems, Mar. 14, 2015, pp. 369-381.
Z. Du, et al., "ShiDianNao: Shifting Vision Processing Closer to the Sensor", ISCA '15 Proceedings of the 42nd Annual International Symposium on Computer Architecture, Jun. 13, 2015, pp. 92-104.
PCT/CN2016/078508—International Search Report, dated Sep. 28, 2016, 9 pages.
201610038994.5—Office Action dated Nov. 5, 2019, 6 pages.

* cited by examiner

TECHNIQUES FOR FLOATING-POINT NUMBER CONVERSION

BACKGROUND

High dynamic range computing has become increasingly important in applications of various fields recently. Comparing with fixed-point numbers, floating-point numbers of an equivalent bit length have wider dynamic range and receive more attention. A bit length may refer to a given length of bits that are used to represent a data group hereinafter. As a result, floating-point number processors are often implemented as a part of a primary processor or as a coprocessor for the primary processor.

When a floating number is used to approximately represent a real number, the format of the floating-point number usually may include a sign bit S, an exponent field E and a mantissa field M, and can be expressed as $\{S, E, M\}$. The format of a floating-point number used in digital computing may be represented as $\{S, E, M\} = (-1)^S \times (1+M) \times 2^E$, in which the base of the exponentiation is set to 2.

The accuracy of a floating-point number may be determined by a bit length of the mantissa field. That is, a floating-point number with a mantissa field of a greater bit length may be more accurate in representing a real number than a floating-point number with a mantissa field of a smaller bit length. Currently, general-purpose processors may be configured to perform addition, subtraction, multiplication, and division operations in compliance with the IEEE 754 standard for floating-point numbers. The format of a 32-bit floating-point number of IEEE754 standard may include one sign bit, eight bits for the exponent field, and twenty-three bits for the mantissa field, in which one or more integer bits of the mantissa field is implicit. The IEEE 754 standard further includes a 64-bit format that may provide a higher accuracy and a wider dynamic range.

Regardless of the formats of floating-point numbers, the implementation of floating-point numbers may result in more complicated computations. Thus, a solution that may speed up floating-point number computations while lowering power consumption has become a key issue in hardware design.

Conventionally, general-purpose processors are often configured to perform computations of floating-point numbers. However, general-purpose processors may be limited to computing floating-point numbers of a single format. One single format may be sufficient for some applications in terms of accuracy and dynamic range but it might not be necessary for other applications. For example, neural network algorithms may not require a high accuracy for floating-point numbers with an exponent field of a greater bit length but may prefer a high accuracy for floating-point numbers with a smaller exponent (weights or the weight variables and gradients in backward propagation algorithm). In the example of neural network algorithms, activation functions such as sigmoid function and tan h function are non-linear and, thus, input data with different levels of accuracy do not show significant difference after treated by activation functions. Therefore, the input data represented in floating-point numbers of high accuracy may cause unnecessary power consumption.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

The present disclosure presents examples of techniques for converting floating-point numbers. An example apparatus may include a storage device configured to store one or more first floating-point numbers of a first bit length, wherein each of the one or more first floating-point numbers includes a first sign bit, a first exponent field, and a first mantissa field. Further, the example apparatus may include a configuration register configured to store an exponent bit length calculated based on the one or more first exponent fields of the one or more first floating-point numbers. In addition, the example apparatus may include a base address register configured to store a base value calculated based on the one or more first exponent fields of the one or more first floating-point numbers. Further still, the example apparatus may include a coder configured to calculate one or more second floating-point numbers of a second bit length based on the calculated exponent bit length and the calculated base value, the one or more second floating-point numbers respectively corresponding to the one or more first floating-point numbers, wherein the first bit length of each of the one or more first floating-point numbers is greater than the second bit length of each of the one or more second floating-point numbers, and wherein each of the one or more second floating-point numbers includes a second sign bit, a second exponent field, and a second mantissa field.

Another example apparatus may include a storage device configured to store one or more first floating-point numbers of a first bit length, wherein each of the one or more first floating-point numbers includes a first sign bit, a first exponent field, and a first mantissa field. The example apparatus may further include a base address register configured to store a base value calculated based on the one or more first exponent fields of the one or more first floating-point numbers. Further still, the example apparatus may include a decoder configured to calculate one or more second floating-point numbers of a second bit length based on the calculated base value, the one or more second floating-point numbers respectively corresponding to the one or more first floating-point numbers, wherein the first bit length of each of the one or more first floating-point numbers is less than the second bit length of each of the one or more floating-point numbers, and wherein each of the one or more second floating-point numbers includes a second sign bit, a second exponent field, and a second mantissa field.

An example method for converting floating-point numbers may include receiving, by a floating-point number converter, an exponent bit length, a base value, and one or more first floating-point numbers of a first bit length, wherein the each of the one or more first floating-point numbers includes a first sign bit, a first exponent field, and a first mantissa field, wherein the exponent bit length is calculated based on the one or more first exponent fields of the one or more first floating-point numbers, and wherein the base value is calculated based on the one or more first exponent fields of the one or more first floating-point numbers. The example method may further include calculating, by a coder, one or more second floating-point numbers of a second bit length based on the calculated exponent bit length and the calculated base value, the one or more second floating-point numbers respectively corresponding to the one or more first floating-point numbers, wherein the first bit length of each of the one or more first floating-point numbers is greater than the second bit length of each of the one or more second floating-point numbers, and wherein each of the one or more second floating-point numbers includes a second sign bit, a second exponent field, and a second mantissa field.

Another example method may include receiving one or more first floating-point numbers of a first bit length and a base value of the one or more first floating-point numbers, wherein each of the one or more first floating-point numbers includes a first sign bit, a first exponent field, and a first mantissa field, and wherein the base value is calculated based on the one or more first exponent fields of the one or more first floating-point numbers. The example method may further include calculating one or more second floating-point numbers of a second bit length based on the calculated base value, the one or more second floating-point numbers respectively corresponding to the one or more first floating-point numbers, wherein the first bit length of each of the one or more first floating-point numbers is less than the second bit length of each of the one or more floating-point numbers, and wherein each of the one or more second floating-point numbers includes a second sign bit, a second exponent field, and a second mantissa field.

To the accomplishment of the foregoing and related ends, the one or more aspects comprise the features herein after fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Various aspects are now described with reference to the drawings. In the following description, for purpose of explanation, numerous specific details are set forth in order to provide a thorough understanding of one or more aspects. It may be evident, however, that such aspect(s) may be practiced without these specific details.

Neural networks are a family of models for a broad range of emerging machine learning and pattern recondition applications. Neural networks techniques are conventionally executed on general-purpose processors such as Central Processing Unit (CPU) and General-purpose Graphics Processing Units (GPGPU). However, general-purpose processors may be limited to computing floating-point numbers of a single format. The capability of processing one single format of floating-point numbers may lead to unnecessary accuracy while increasing power consumption and memory usage.

As described in greater detail below, a floating-point number processor may be implemented as a part of a general-purpose processor or as a coprocessor to convert floating-point numbers. That is, the floating-point number processor may be configured to convert a first group of floating-point numbers to a second group of floating-point numbers. Bits lengths of different fields of the second group of floating-point numbers may be shorter than those of the first group of floating-point numbers. Thus, computing of the second group of floating-point numbers may cost less power consumption.

Subsequent to the computing, results of the computing of the second group of floating-point numbers may be converted by the floating-point number processor again such that the results may be of a same format as the first group of floating-point numbers. The converted results may then be transmitted to a storage device.

In some other examples, however, the bit lengths of the first group of floating-point numbers may not provide sufficient accuracy for the computing. In these examples, the floating-point number processor may be configured to convert the first group of floating-point numbers to a second group of floating-point numbers, bit lengths of the second group of floating-point numbers being longer than those of the first group of floating-point numbers.

As such, the implementation of the floating-point number processor may provide flexibility in computing floating-point numbers such that the general-purpose processor may be no longer limited to a single format of floating-point numbers.

Figure 1:
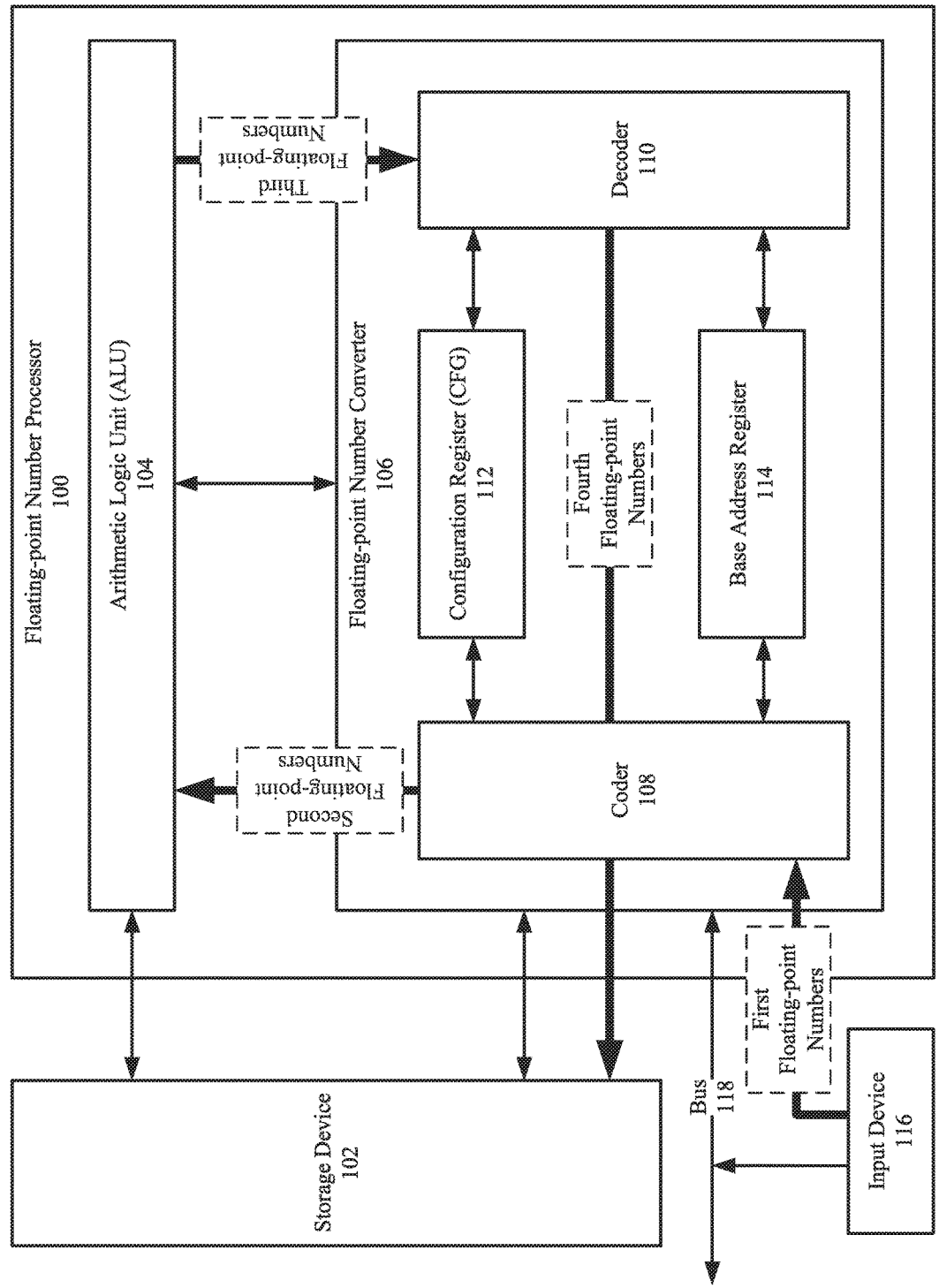
FIG. 1 is a block diagram illustrating an example floating-point number processor in which floating-point number conversion may be implemented.

Referring to FIG. 1, a block diagram illustrates an example floating-point number processor 100 in which floating-point number conversion may be implemented in accordance with aspects of the present disclosure. The floating-point number processor 100 and the components therein may be implemented as hardware, firmware, or software components, or any combination thereof.

As depicted, the floating-point number processor 100 may be configured to receive one or more first floating-point numbers of a first bit length from an input device 116 or from a storage device 102. The one or more first floating-point numbers may be converted by the floating-point number processor 100 to one or more second floating-point numbers of a second bit length for further computing. The results of the computing, e.g., one or more third floating-point numbers, may be further converted, by the floating-point number processor 100, to one or more fourth floating-point numbers of the first bit length, e.g., in a same format as the first floating-point numbers. The fourth floating-point numbers may further be transmitted to and stored in the storage device 102.

In more detail, the floating-point number processor 100 may include a floating-point number converter 106 and an Arithmetic Logic Unit (ALU) 104. In some examples, the first floating-point numbers may be received from the input device 116 via a bus 118. Data may be transmitted and/or received via the bus to and from other components that are not shown in FIG. 1. Each of the first floating-point numbers may be represented as $(-1)^{S1} \times (1+M1) \times 2^{E1}$, in which S1 denotes the sign of the corresponding first floating-point number, M1 denotes the mantissa of the corresponding first floating-point number, and E1 denotes the exponent of the corresponding first floating-point number.

In other words, each of the first floating-point numbers, when stored as a series of bits, may include a first sign bit, a first exponent field, and a first mantissa field. The first sign bit may refer to a bit that indicates the sign of the corresponding first floating-point number and may be assigned with a value of 0 or 1. The first exponent field may refer to a number of bits that store a value of the exponent of the corresponding first floating-point number. The bit length of the first exponent field may be referred to as K1 hereinafter. The first mantissa field may refer to a number of bits that store a value of the mantissa of the corresponding first floating-point number. The bit length of the first mantissa field may be referred to as K2 hereinafter. In an example of IEEE 754 standard (single type), K1 and K2 may be respectively set to 8 and 23.

In some aspects, an exponent bit length and a base value may be received from the input device 116 via the bus 118 along with the first floating-point numbers. The exponent bit length (may be referred to as "N") may be calculated based on the first exponent fields of the first floating-point numbers. For example, the exponent bit length N may be calculated based on a maximum value and a minimum value of the first exponent fields, e.g., in accordance with a formula:

$$N = \log_2(E_{max} - E_{min})/2,$$

in which $E_{max}$ refers to the maximum value of the first exponent fields, and $E_{min}$ refers to the minimum value of the first exponent fields.

The base value (may be referred to as "A") may be similarly calculated based on the maximum value and the minimum value of the first exponent fields, e.g., in accordance with another formula: $A = (E_{max} - E_{min})/2$, in which $E_{max}$ refers to the maximum value of the first exponent fields and $E_{min}$ refers to the minimum value of the first exponent fields.

In these aspects, the exponent bit length N and the base value A may be calculated outside the floating-point number processor 100 prior to being transmitted from the input device 116 to the floating-point number converter 106. In some other aspects, the exponent bit length N and the base value A may be temporarily stored in the storage device 102 after being received via the bus 118 and may be further retrieved by the floating-point number converter 106 at a later time for converting. In some other aspects, subsequent to receiving the first floating-point numbers, the floating-point number converter 106 may be configured to calculate the exponent bit length N and the base value A similarly based on the maximum value and the minimum value of the first exponent fields.

According to the present aspects, the floating-point number converter 106 may further include a coder 108, a decoder 110, a configuration register (CFG) 112, and a base address register 114. The CFG 112 and the based address register 114 may respectively refer to a portion of an on-board memory integrated in the floating-point number converter 106 and, thus, may provide direct access for the coder 108 and the decoder 110. The CFG 112 may be configured to store the exponent bit length N and the base address register 114 may be configured to store the base value A.

After the floating-point number converter 106 receives the first floating-point numbers, the coder 108 may be configured to calculate one or more second floating-point numbers.

Each of the second floating-point numbers may respectively correspond to one of the first floating-point numbers. That is, each second floating-point number may be calculated based on a corresponding first floating-point number and other parameters of the group of first floating-point numbers. However, a bit length of the second floating-point numbers (e.g., a total number of bits of each second floating-point number) may be different from that of the first floating-point numbers. In some aspects, the bit length of the second floating-point numbers may be preset to a fixed value, e.g., 16, 32, 64, 128, etc., which may be either less or greater than the bit length of the first floating-point numbers. Similar to the first floating-point numbers, each of the second floating-point numbers may be represented as $(-1)^{S2} \times (1+M2) \times 2^{E2}$, in which S2 denotes the sign of the corresponding second floating-point number, M2 denotes the mantissa of the corresponding second floating-point number, and E2 denotes the exponent of the corresponding second floating-point number.

That is, each of the second floating-point numbers, as a series of bits, may include a second sign bit, a second exponent field, and a second mantissa field. Similar to the first sign bit, the second sign bit may refer to a bit that indicates the sign of the corresponding second floating-point number and may be assigned with a value of 0 or 1. The second exponent field may refer to one or more bits that store a value of the exponent of the corresponding second floating-point number. The second mantissa field may refer to one or more bits that store a value of the mantissa of the corresponding second floating-point number.

To calculate the second floating-point numbers, the coder 108 may be configured to determine the bit lengths of the second exponent field and the second mantissa field. For example, the coder 108 may be configured to determine the bit length of the second exponent field to be the same as the calculated exponent bit length N. The bit length of the second mantissa field may be determined by the coder 108 in accordance with a formula: $L2 = C - N - 1$, in which L2 denotes the bit length of the second mantissa field of the corresponding second floating-point number, N denotes the exponent bit length, and C denotes the preset bit length of the second floating-point numbers.

Further, the coder 108 may be configured to determine the respective values of the second sign bit, the second exponent field, and the second mantissa field. In some aspects, the coder 108 may be configured to assign the second sign bit a same value as the first sign bit. The value of the second exponent field may be calculated by the coder 108 based on a corresponding first exponent field, an exponent bias of the first floating-point numbers, and the base value A stored in the base address register 114. The exponent bias of the first floating-point numbers are determined by the format standard of the first floating-point numbers. For example, if the first floating-point numbers are in compliance with IEEE 754 standard (single type), the exponent bias of the floating-point numbers may be set to 127 according to the IEEE 754 standard. The value of the second exponent field may be determined in accordance with the following example formula: $E2 = E1 - B + A$, in which E2 denotes the value of the second exponent field, E1 denotes the value of the first exponent field, B denotes the exponent bias of the first floating-point numbers, and A denotes the base value.

Further to the aspects, the coder 108 may be configured to determine the value of the second mantissa field. As the bit length of the second mantissa field may have been determined, the coder 108 may be configured to select one or more most significant bits (MSB) of the corresponding first mantissa field to be the value of the second mantissa field. The number of MSBs may be the determined bit length of the second mantissa field, e.g., C−N−1, in which N denotes the exponent bit length and C denotes the preset bit length of the second floating-point numbers. In an example that the first floating-point numbers comply with IEEE 754 (single type) and the second floating-point numbers comply with IEEE 754-2008 (Half), the bit length of the first mantissa field may be set to 23 and the bit length of the second mantissa field may be set to 10. In this example, the coder 108 may be configured to select the 10 MSBs of the first mantissa field and assign the 10 MSBs to be the value of the second mantissa field.

When the respective values and bit lengths of different fields of the second floating-point numbers are determined, the second floating-point numbers are calculated; that is, the first floating-point numbers are converted to the second floating-point numbers.

In some aspects, the calculated second floating-point numbers may be further transmitted by the floating-point number converter 106 to the ALU 104 for computing or processing. The computing may include operations such as multiplication, addition, etc. When the computing completes, results of the computing, e.g., one or more third floating-point numbers, may be transmitted from the ALU 104 to the floating-point number converter 106. The third floating-point numbers may be in a same format as the second floating-point numbers. In other words, each of the third floating-point numbers may similarly include a third sign bit, a third exponent field, and a third mantissa filed, the bit length of the third exponent field being the same as the bit length of the second exponent field and the bit length of the third mantissa field being the same as the bit length of the second mantissa field.

Upon the floating-point number converter 106 receiving the third floating-point numbers, the decoder 110 may be configured to convert the third floating-point numbers to one or more fourth floating-point numbers further based on a modified base value (may be referred to as "A'").

In some aspects, the fourth floating-point numbers may be in a same format as the first floating-point numbers. That is, each of the fourth floating-point numbers may include a fourth sign bit, a fourth exponent field, and a fourth mantissa field. The bit lengths of the fourth exponent field and the fourth mantissa field may respectively be the same as those of the first exponent field and the first mantissa field.

The modified base value A' may be predetermined and transmitted from the input device 116 to the base address register 114. In one example, the modified base value A' may be predetermined in accordance with a formula: A'=(E'$_{max}$−E'$_{min}$)/2, in which E'$_{max}$ refers to an estimated maximum value of the fourth exponent fields and E'$_{min}$ refers to an estimated minimum value of the fourth exponent fields. E'$_{max}$ and E'$_{min}$ may be estimated based on a model of the current neural network in process. In some other examples, the modified based value A' may be assigned with a value equal to the base value A.

In more detail, the decoder 110 may be configured to determine the fourth floating-point numbers based on the modified base value A' stored in the base address register 114. In an example that the first floating-point numbers comply with the IEEE 754 standard (single type), the bit lengths of the first exponent field and the first mantissa field may be fixed, e.g., K1 and K2 as described above. As such, the respective bit lengths for the fourth exponent field and the fourth mantissa field may be similarly fixed in accordance with the standard. Thus, as the respective bit lengths of the fourth floating-point numbers are determined, the decoder 110 may be configured to determine the values of the fourth sign bit, the fourth exponent field, and the fourth mantissa field.

Similar to the determination of the second sign bit, the decoder 110 may be configured to assign the fourth sign bit with a same value as the third sign bit.

With respect to the fourth exponent field, the decoder 110 may be configured to determine the value of the fourth exponent field based on the value of a corresponding third exponent field, an exponent bias defined by the standard that the fourth floating-point numbers comply with, and the modified base value A' stored in the base address register 114. For example, the value of the fourth exponent field may be determined in accordance with a formula: E4=E3+B'−A', in which E4 denotes the value of the fourth exponent field, E3 denotes the value of the corresponding third exponent field, B' denotes the exponent bias of the fourth floating-point numbers, and A' denotes the modified base value. In some aspects, as the fourth floating-point numbers may be in a same format as the first floating-point numbers, the exponent bias B' of the fourth floating-point numbers may be the same as the exponent bias B of the first floating-point numbers.

With respect to the fourth mantissa field, the decoder 110 may be configured to assign a same value as the corresponding third mantissa field to one or more MSBs of the fourth mantissa field. In an example that the third floating-point numbers comply with IEEE 754-2008 (Half) standard and the fourth floating-point numbers comply with IEEE 754 (single type), the bit length of the third mantissa field is set to 10 and the bit length of the fourth mantissa field is set to 23. In this example, the decoder 110 may be configured to assign the ten MSBs of the fourth mantissa field with the value of the third mantissa field. Other bits of the fourth mantissa field (e.g., the 13 least significant bits) may be set to zeroes.

With the respective bit lengths and values of different fields determined, the fourth floating-point numbers are calculated. In other words, the third floating-point numbers are converted to the fourth floating-point numbers. The calculated fourth floating-point numbers may then be transmitted by the decoder 110 to the storage device 102.

It is notable that, in some aspects, the bit length of the first floating-point numbers may be less than the bit length of the second floating-point numbers. In other words, the floating-point number converter 106 may be configured to convert floating-point numbers of a smaller bit length to floating-point numbers of a greater bit length and transmit the converted floating-point numbers to the ALU 104 for further processing. Similarly, the results of the processing may be converted to floating-point numbers of a smaller bit length. The structure of the floating-point number converter 106 may remain the same, whereas the decoder 110 may be configured to convert the first floating-point numbers prior to the processing or computing at the ALU 104 and the coder 108 may be configured to convert the computing results afterwards.

Figure 2:
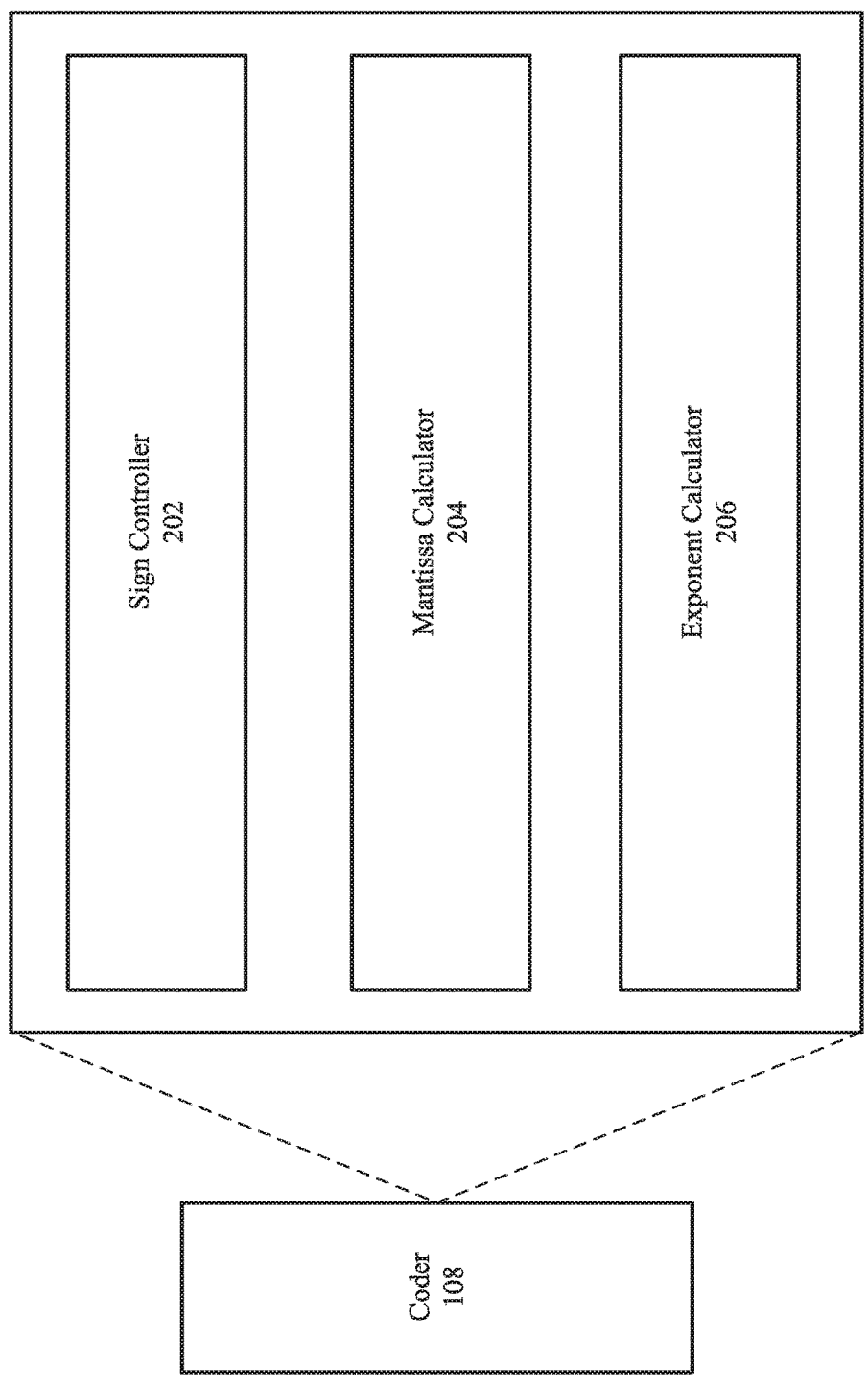
FIG. 2 is a block diagram illustrating an example coder by which floating-point number conversion may be implemented.

Referring to FIG. 2, a block diagram illustrates an example coder 108 by which floating-point number conversion may be implemented in accordance with aspects of the present disclosure. As depicted, the coder 108 may include a sign controller 202, a mantissa calculator 204, and an exponent calculator 206. The coder 108 and the components thereof, including the sign controller 202, the mantissa calculator 204, and the exponent calculator 206, may be implemented as hardware, firmware, or software components, or any combination thereof.

In some aspects, upon the coder 108 receiving the first floating-point numbers, the sign controller 202 may be configured to assign the second sign bit a same value as the first sign bit.

In these aspects, the mantissa calculator 204 may be configured to determine the bit length of the second mantissa field. The mantissa calculator 204 may be implemented as one or more multiplexers. The bit length of the second mantissa field may be determined by the mantissa calculator 204 in accordance with a formula: L2=C−N−1, in which L2 denotes the bit length of the second mantissa field of the corresponding second floating-point number, N denotes the exponent bit length, and C denotes the preset bit length of the second floating-point numbers.

Further, the mantissa calculator 204 may be configured to determine the value of the second mantissa field. In some aspects, the mantissa calculator 204 may be configured to select one or more MSBs of the corresponding first mantissa field to be the value of the second mantissa field. As described above, the number of MSBs may be the determined bit length of the second mantissa field, e.g., C−N−1, in which N denotes the exponent bit length and C denotes the preset bit length of the second floating-point numbers.

Further to these aspects, the exponent calculator 206 may be configured to determine the bit length of the second exponent field. The exponent calculator 206 may be implemented as one or more adders. For example, the exponent calculator 206 may be configured to determine the bit length of the second exponent field to be the same as the calculated exponent bit length N, e.g., in accordance with the previously described formula: $N=\log_2(E_{max}-E_{min})/2$, in which $E_{max}$ refers to the maximum value of the first exponent fields, and $E_{min}$ refers to the minimum value of the first exponent fields.

Further still, the exponent calculator 206 may be configured to calculate the value of the second exponent field based on a corresponding first exponent field, an exponent bias of the first floating-point numbers, and the base value A stored in the base address register 114. For example, the value of the second exponent field may be determined in accordance with the following example formula: E2=E1−B+A, in which E2 denotes the value of the second exponent field, E1 denotes the value of the first exponent field, B denotes the exponent bias of the first floating-point numbers, and A denotes the base value.

Figure 3:
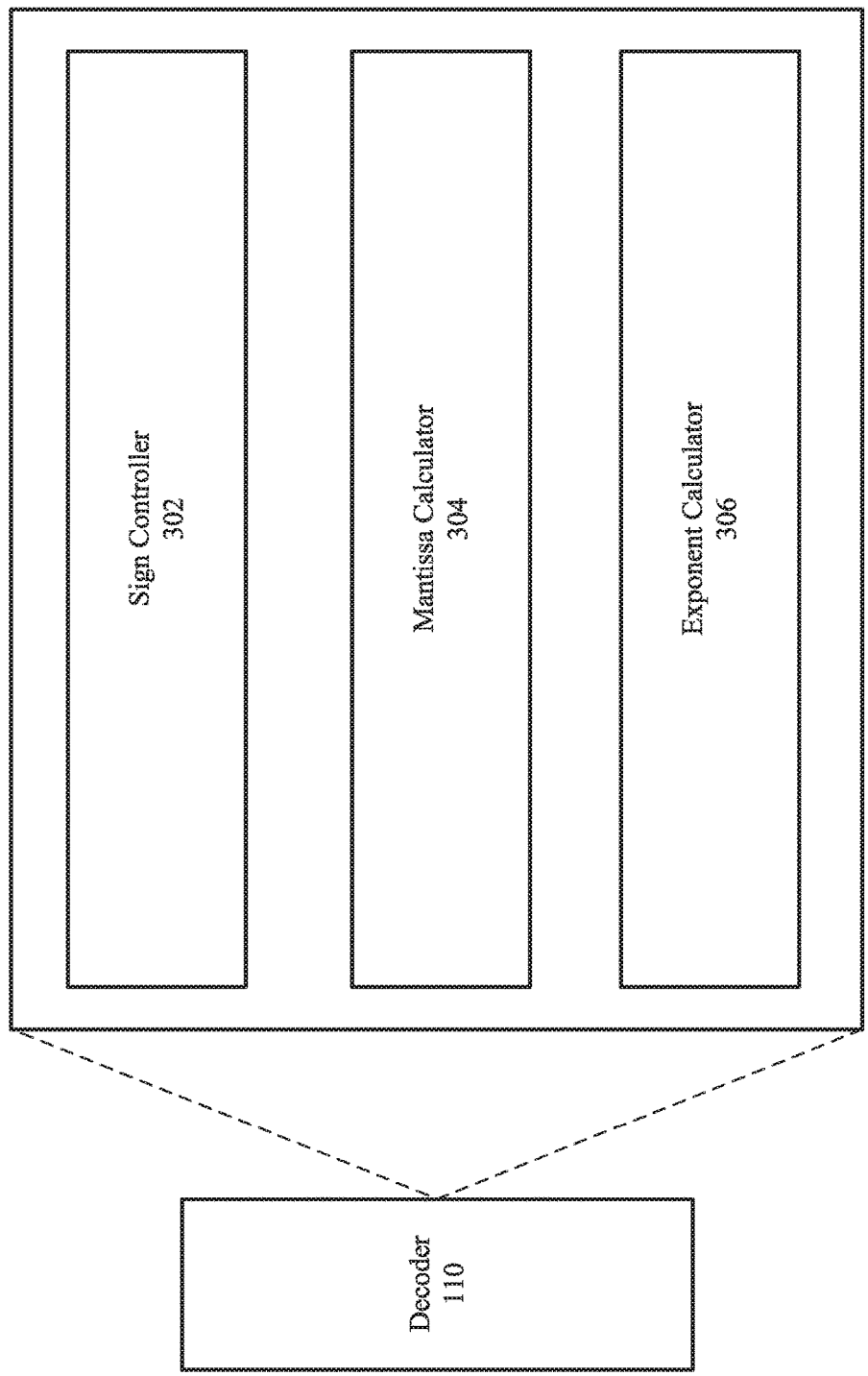
FIG. 3 is a block diagram illustrating an example decoder by which floating-point number conversion may be implemented.

Referring to FIG. 3, a block diagram illustrates an example decoder 110 by which floating-point number conversion may be implemented in accordance with aspects of the present disclosure. As depicted, the decoder 110 may include a sign controller 302, a mantissa calculator 304, and an exponent calculator 306. The decoder 110 and the components thereof, including the sign controller 302, the mantissa calculator 304, and the exponent calculator 306, may be implemented as hardware, firmware, or software components, or any combination thereof.

As described above, upon the decoder 110 receiving the third floating-point numbers from the ALU 104, the decoder 110 may be configured to convert the third floating-point numbers to one or more corresponding fourth floating-point numbers. In some aspects, the fourth floating-point numbers may be in a same format as the first floating-point numbers. That is, the bit lengths of the fourth exponent field and the fourth mantissa field may respectively be the same as those of the first exponent field and the first mantissa field. Thus, as the bit lengths may have been fixed, the sign controller the mantissa calculator 304, and the exponent calculator 306 may be configured to respectively determine the values of the fourth sign bit, the fourth exponent field, and the fourth mantissa field.

In more detail, similar to the determination of the second sign bit, the sign controller 302 may be configured to assign the fourth sign bit with a same value as the third sign bit.

With respect to the fourth mantissa field, the mantissa calculator 304 may be configured to assign a same value as the corresponding third mantissa field to one or more MSBs of the fourth mantissa field. In the previous example that the third floating-point numbers comply with IEEE 754-2008 (Half) standard and the fourth floating-point numbers comply with IEEE 754 (single type), the bit length of the third mantissa field is set to 10 and the bit length of the fourth mantissa field is set to 23. The mantissa calculator 304 may be configured to assign the ten MSBs of the fourth mantissa field with the value of the third mantissa field. Other bits of the fourth mantissa field (e.g., the 13 least significant bits) may be set to zeroes. In some aspects, the mantissa calculator 304 may be implemented as one or more multiplexers.

With respect to the fourth exponent field, the exponent calculator 306 may be configured to determine the value of the fourth exponent field based on the value of a corresponding third exponent field, an exponent bias defined by the standard that the fourth floating-point numbers comply with, and the modified base value A' stored in the base address register 114. As the previously described example, the value of the fourth exponent field may be determined in accordance with a formula: E4=E3−B'+A', in which E4 denotes the value of the fourth exponent field, E3 denotes the value of the third exponent field, B' denotes the exponent bias of the fourth floating-point numbers, and A' denotes the base value. In some aspects, the exponent calculator 306 may be implemented as one or more adders.

Figure 4:
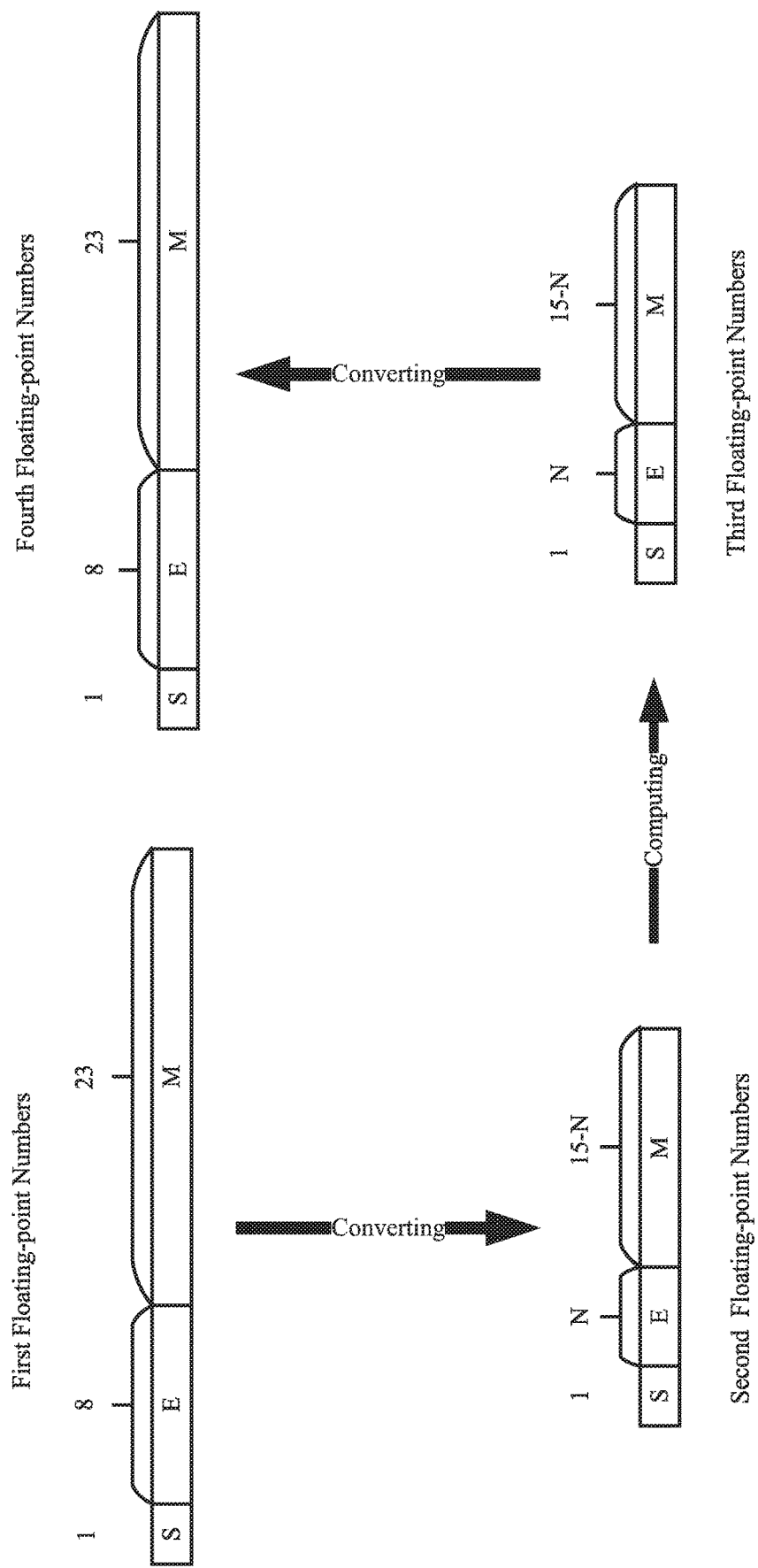
FIG. 4 is a diagram illustrating an example floating-point number conversion process.

Referring to FIG. 4, a diagram illustrates an example floating-point number conversion process in accordance with aspects of the present disclosure. In this example, as depicted, the first and the fourth floating-point numbers are in compliance with IEEE 754 (single type) and the second and the third floating-point numbers are in compliance with IEEE 754-2008 (Half). That is, the total bit length of the first and the fourth floating-point numbers may be set to 32 and the total bit length of the second and the third floating-point numbers may be set to 16 according to the respective standards. The bit length of the first exponent field and the fourth exponent field may be set to 8 and the bit length for the first mantissa field and the fourth mantissa field may be set to 23.

When the first floating-point numbers are converted by the coder 108, the exponent calculator 206 may be configured to determine the bit length of the second exponent field to be the same as the calculated exponent bit length N. The mantissa calculator 204 may be configured to determine the bit length of the second mantissa field in accordance with a formula: L2=C−N−1, in which C equals to 16 here and N denotes the exponent bit length. Thus, the bit length of the second mantissa field may be determined to be a value of 15-N. The second floating-point numbers may then be transmitted from the coder 109 to the ALU 104 for further processing or computing.

Since the third floating-point numbers are the results of processing or computing the second floating-point numbers, the bit lengths of respective fields of the third floating-point numbers may be the same as those of the second floating-point numbers. That is, the bit lengths for the third exponent field and the third mantissa field may be respectively determined to be the exponent bit length N and a value of 15-N. The third floating-point numbers may then be transmitted from the ALU 104 to the decoder 110.

The decoder 110, as previously described, may be configured to convert the third floating-point numbers to the fourth floating-point numbers. In some aspects, the fourth floating-point numbers may be in a same format as the first floating-point numbers. That is, the bit lengths of the fourth exponent field and the fourth mantissa field may respectively be the same as those of the first exponent field and the first mantissa field. That is, the bit length of the fourth exponent field may be set to 8 and the bit length of the fourth mantissa field may be set to 23.

Figure 5:
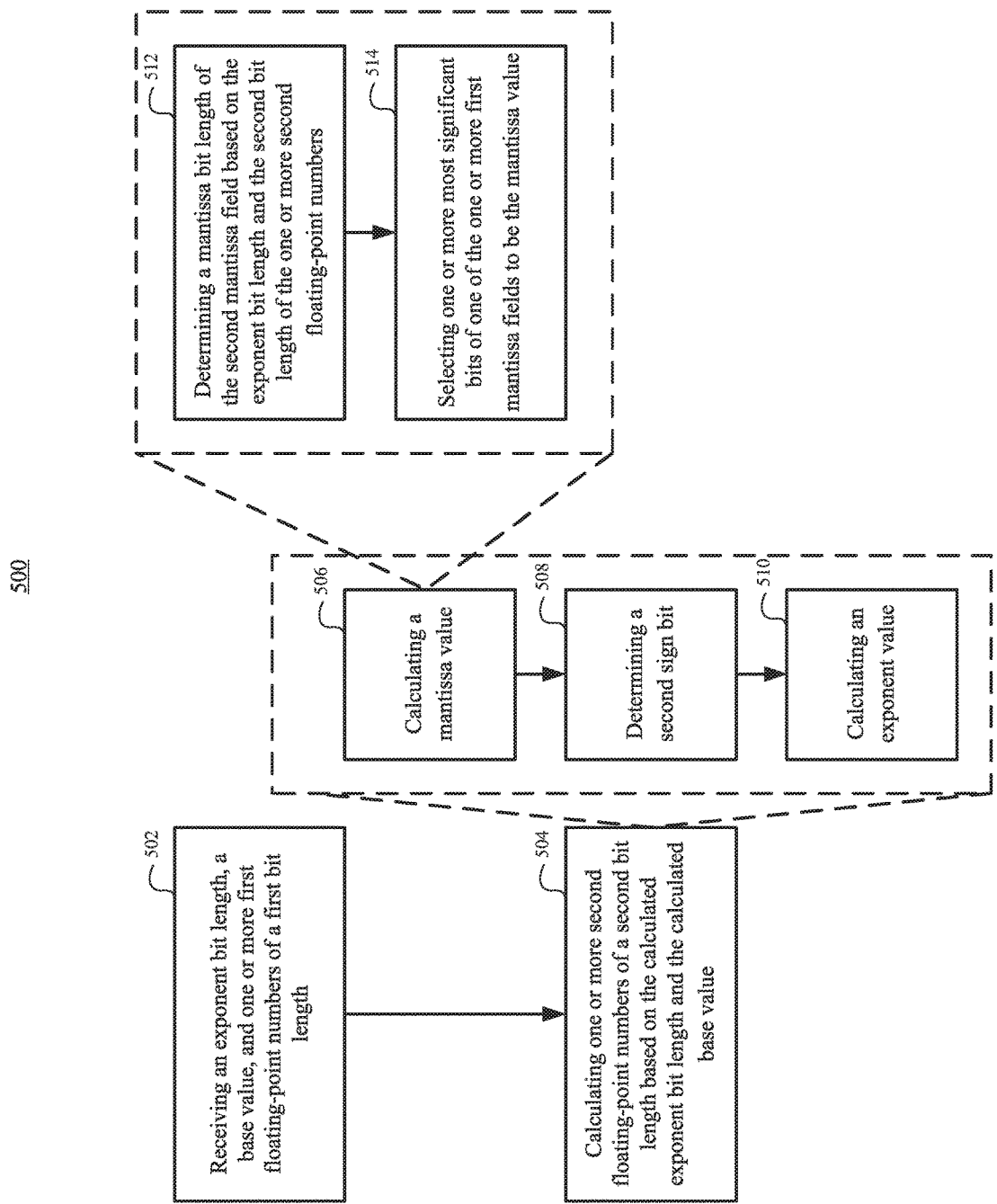
FIG. 5 is a flow chart of aspects of an example method for converting floating-point numbers.

Referring to FIG. 5, a flow chart shows aspects of an example method 500 for converting floating-point numbers in accordance with aspects of the present disclosure. The method 500 may be performed by one or more components of the floating-point number processor 100 of FIG. 1 and the components thereof of FIG. 2. More specifically, the method 500 may be performed by the coder 108, the sign controller 202, the mantissa calculator 204, and the exponent calculator 206. As illustrated in FIG. 5, dash-lined blocks may indicate sub-processes or sub-operations within a process or operation.

At block 502, method 500 includes receiving, by the floating-point number converter 106, an exponent bit length, a base value, and one or more first floating-point numbers of a first bit length. In some aspects, as previously described, each of the one or more first floating-point numbers may include a first sign bit, a first exponent field, and a first mantissa field. The exponent bit length N and the base value A may be calculated based on the first exponent fields. The example process of method 500 may continue to block 504.

At block 504, method 500 includes calculating, by the coder 108, one or more second floating-point numbers of a second bit length based on the calculated exponent bit length and the calculated base value, the one or more second floating-point numbers respectively corresponding to the one or more first floating-point numbers. The first bit length of each of the one or more first floating-point numbers may be greater than the second bit length of each of the one or more second floating-point numbers. Each of the one or more second floating-point numbers may include a second sign bit, a second exponent field, and a second mantissa field. Block 504 may further include sub-processes or sub-operations such as block 506, block 508, and block 510.

At block 506, method 500 may include calculating, by the mantissa calculator 204, a mantissa value of the second mantissa field. Block 506 may further include sub-processes or sub-operations such as block 512 and block 514.

At block 512, method 500 may include determining a mantissa bit length of the second mantissa field based on the exponent bit length and the second bit length. In some aspects, the bit length of the second mantissa field may be determined by the mantissa calculator 204 in accordance with a formula: L2=C−N−1, in which L2 denotes the bit length of the second mantissa field of the corresponding second floating-point number, N denotes the exponent bit length, and C denotes the preset bit length of the second floating-point numbers.

At block 514, method 500 may include selecting one or more MSBs of one of the one or more first mantissa fields to be the mantissa value. In some aspects, the mantissa calculator 204 may be configured to select one or more MSBs of the corresponding first mantissa field to be the value of the second mantissa field. As described above, the number of MSBs may be the determined bit length of the second mantissa field.

At block 508, method 500 may include determining a second sign bit. In some aspects, upon the coder 108 receiving the first floating-point numbers, the sign controller 202 may be configured to assign the second sign bit a same value as the first sign bit.

At block 510, method 500 may include calculating an exponent value. In some aspects, the exponent calculator 206 may be configured to calculate the value of the second exponent field based on a corresponding first exponent field, an exponent bias of the first floating-point numbers, and the base value A stored in the base address register 114. For example, the value of the second exponent field may be determined in accordance with the following example formula: E2=E1−B+A, in which E2 denotes the value of the second exponent field, E1 denotes the value of the first exponent field, B denotes the exponent bias of the first floating-point numbers, and A denotes the base value.

Figure 6:
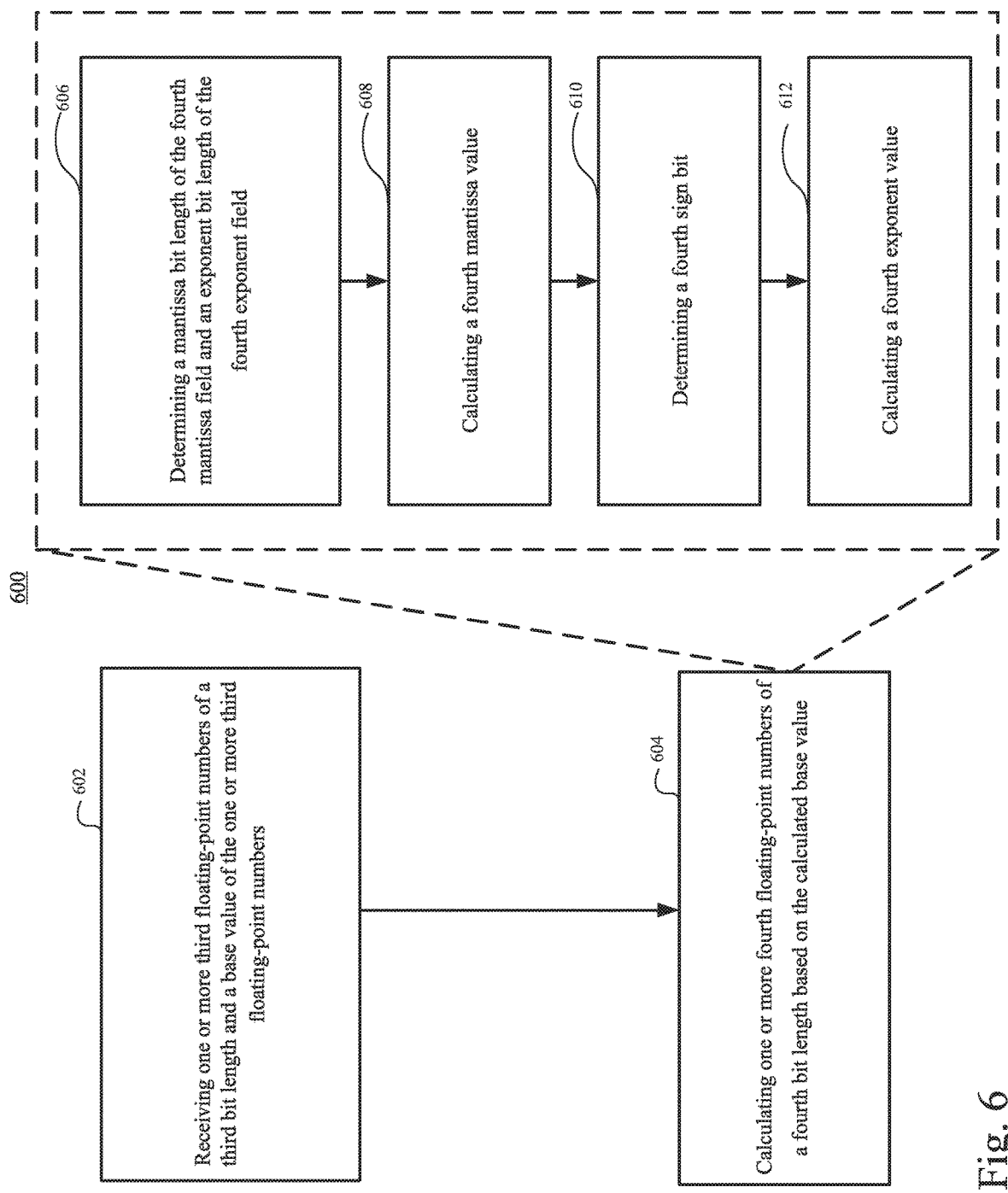
FIG. 6 is a flow chart of aspects of another example method for converting floating-point number.

Referring to FIG. 6, a flow chart shows aspects of another example method 600 for floating-point number conversion in accordance with aspects of the present disclosure. The method 600 may be performed by one or more components of floating-point number processor 100 of FIG. 1 and the component thereof in FIG. 3. More specifically, the method 600 may be performed by the decoder 110, the sign controller 302, the mantissa calculator 304, and the exponent calculator 306. As illustrated in FIG. 6, dash-lined blocks may indicate sub-processes or sub-operations within a process or operation.

At block 602, method 600 may include receiving one or more third floating-point numbers of a third bit length. Each of the third floating-point numbers includes a third sign bit, a third exponent field, and a third mantissa field. The example process of method 600 may continue to block 604.

At block 604, method 600 may include calculating one or more fourth floating-point numbers of a fourth bit length based on the modified base value A', the fourth floating-point numbers respectively corresponding to the third floating-point numbers. The third bit length of the third floating-point numbers may be less than the fourth bit length of the fourth floating-point numbers. Each of the fourth floating-point numbers may include a fourth sign bit, a fourth exponent field, and a fourth mantissa field. Block 604 may further include sub-processes or sub-operations such as block 606, block 608, block 610, and block 612.

At block 606, method 600 may include determining, by the mantissa calculator 304 and the exponent calculator 306, a mantissa bit length of the fourth mantissa field and an exponent bit length of the fourth exponent field in accordance with a predetermined format of the fourth floating-point numbers. As described above, the fourth floating-point numbers may be in a same format as the first floating-point numbers. As such, the respective bit lengths for the fourth exponent field and the fourth mantissa field may be similarly fixed as the first floating-point numbers.

At block 608, method 600 may include calculating, by the mantissa calculator 304, a fourth mantissa value. For example, the mantissa calculator 304 may be configured to assign a same value as the corresponding third mantissa field to one or more MSBs of the fourth mantissa field. In the aforementioned example that the third floating-point numbers comply with IEEE 754-2008 (Half) standard and the fourth floating-point numbers comply with IEEE 754 (single type), the bit length of the third mantissa field is set to 10 and the bit length of the fourth mantissa field is set to 23. In this example, the decoder 110 may be configured to assign the ten MSBs of the fourth mantissa field with the value of the third mantissa field. Other bits of the fourth mantissa field (e.g., the 13 least significant bits) may be set to zeroes.

At block 610, method 600 may include determining, by the sign controller 302, the fourth sign bit. For example, similar to the determination of the second sign bit, the sign controller 302 may be configured to assign the fourth sign bit with a same value as the third sign bit.

At block 612, method 600 may include calculating, by the exponent calculator 306, a fourth exponent value. As shown above, the exponent calculator 306 may be configured to determine the value of the fourth exponent field based on the value of a corresponding third exponent field, an exponent bias defined by the standard that the fourth floating-point numbers comply with, and the modified base value A' stored in the base address register 114. For example, the value of the fourth exponent field may be determined in accordance with a formula: E4=E3−B'+A', in which E4 denotes the value of the fourth exponent field, E3 denotes the value of the third exponent field, B' denotes the exponent bias of the fourth floating-point numbers, and A' denotes the modified base value. In some aspects, as the fourth floating-point numbers may be in a same format as the first floating-point numbers, the exponent bias B' of the fourth floating-point numbers may be the same as the exponent bias B of the first floating-point numbers.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described herein that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

We claim:

1. An apparatus for converting floating-point numbers, comprising:
    a storage device configured to store one or more first floating-point numbers of a first bit length, wherein each of the one or more first floating-point numbers includes a first sign bit, a first exponent field, and a first mantissa field;
    a configuration register configured to store an exponent bit length calculated based on a maximum value of the one or more first exponent fields and a minimum value of the one or more first exponents fields of the one or more first floating-point numbers;
    a base address register configured to store a base value calculated based on the one or more first exponent fields of the one or more first floating-point numbers; and
    a coder configured to calculate one or more second floating-point numbers of a second bit length based on the calculated exponent bit length and the calculated base value, the one or more second floating-point numbers respectively corresponding to the one or more first floating-point numbers,
        wherein the first bit length of each of the one or more first floating-point numbers is greater than the second bit length of each of the one or more second floating-point numbers, and
        wherein each of the one or more second floating-point numbers includes a second sign bit, a second exponent field, and a second mantissa field.

2. The apparatus of claim 1, wherein the exponent bit length is calculated in accordance with a formula:

$$N = \log_2(E_{max} - E_{min})/2, \text{ wherein}$$

N refers to the exponent bit length, $E_{max}$ refers to the maximum value of the one or more first exponent fields, and $E_{min}$ refers to the minimum value of the one or more first exponent fields.

3. The apparatus of claim 1, wherein the base value is calculated based on a maximum value of the one or more first exponent fields and a minimum value of the one or more first exponent fields.

4. The apparatus of claim 1, wherein the coder further comprises:
    a mantissa calculator configured to calculate a mantissa value of the second mantissa field;
    a sign controller configured to determine the second sign bit; and
    an exponent calculator configured to calculate an exponent value of the second exponent field.

5. The apparatus of claim 4, wherein the mantissa calculator is configured to select one or more most significant bits of one of the one or more first mantissa fields to be the mantissa value.

6. The apparatus of claim 5, wherein the mantissa calculator is further configured to determine a mantissa bit length of the second mantissa field based on the exponent bit length and the second bit length of the one or more second floating-point numbers.

7. The apparatus of claim 6, wherein the mantissa calculator is further configured to determine the mantissa bit length of the second mantissa field in accordance with a formula:

$$L = C - N - 1, \text{ wherein}$$

L refers to the mantissa bit length of the second mantissa field, N refers to the exponent bit length, and C refers to the second bit length of the one or more second floating-point numbers.

8. The apparatus of claim 4, wherein the sign controller is configured to assign a same value as the first sign bit to the second sign bit.

9. The apparatus of claim 4, wherein the exponent calculator is configured to calculate the exponent value of the second exponent field based on the first exponent field of a corresponding one of the one or more first floating-point numbers, an exponent bias of the one or more first floating-point numbers, and the base value stored in the base address register.

10. An apparatus for converting floating-point numbers, comprising:
a storage device configured to store one or more first floating-point numbers of a first bit length, wherein each of the one or more first floating-point numbers includes a first sign bit, a first exponent field, and a first mantissa field;
a base address register configured to store a base value calculated based on a maximum value of the one or more first exponent fields and a minimum value of the one or more first exponent fields of the one or more first floating-point numbers;
a decoder configured to calculate one or more second floating-point numbers of a second bit length based on the calculated base value, the one or more second floating-point numbers respectively corresponding to the one or more first floating-point numbers,
wherein the first bit length of each of the one or more first floating-point numbers is less than the second bit length of each of the one or more floating-point numbers, and
wherein each of the one or more second floating-point numbers includes a second sign bit, a second exponent field, and a second mantissa field.

11. The apparatus of claim 10, wherein a mantissa bit length of the second mantissa field and an exponent bit length of the second exponent field are determined in accordance with a predetermined format of the one or more second floating-point numbers.

12. The apparatus of claim 10, wherein the decoder further comprises:
a sign controller configured to determine the second sign bit;
a mantissa calculator configured to calculate a mantissa value of the second mantissa field; and
an exponent calculator configured to calculate an exponent value of the second exponent field.

13. The apparatus of claim 10, wherein the mantissa calculator is configured to determine the mantissa value of the second mantissa field by assigning a same value as the corresponding first mantissa field to one or more most significant bits of the second mantissa field.

14. The apparatus of claim 12, wherein the exponent calculator is configured to calculate the exponent value of the second exponent field based on the first exponent field, an exponent bias of a corresponding one of the one or more first floating-point numbers, and the base value stored in the base address register.

15. A method for converting floating-point numbers, comprising:
receiving, by a floating-point number converter, an exponent bit length, a base value, and one or more first floating-point numbers of a first bit length,
wherein each of the one or more first floating-point numbers includes a first sign bit, a first exponent field, and a first mantissa field,
wherein the exponent bit length is calculated based on a maximum value of the one or more first exponent fields and a minimum value of the one or more first exponent fields of the one or more first floating-point numbers, and
wherein the base value is calculated based on the one or more first exponent fields of the one or more first floating-point numbers; and
calculating, by a coder, one or more second floating-point numbers of a second bit length based on the calculated exponent bit length and the calculated base value, the one or more second floating-point numbers respectively corresponding to the one or more first floating-point numbers,
wherein the first bit length of each of the one or more first floating-point numbers is greater than the second bit length of each of the one or more second floating-point numbers, and
wherein each of the one or more second floating-point numbers includes a second sign bit, a second exponent field, and a second mantissa field.

16. The method of claim 15, wherein the calculating further comprises:
calculating, by a mantissa calculator, a mantissa value of the second mantissa field;
determining, by a sign controller, the second sign bit; and
calculating, by an exponent calculator, an exponent value of the second exponent field.

17. The method of claim 16, wherein the calculating the mantissa value of the second mantissa field comprises selecting one or more most significant bits of one of the one or more first mantissa fields to be the mantissa value.

18. The method of claim 17, wherein the calculating the mantissa value of the second mantissa field further comprises determining a mantissa bit length of the second mantissa field based on the exponent bit length and the second bit length of the one or more second floating-point numbers.

19. The method of claim 18, wherein the determining the mantissa bit length of the second mantissa field in accordance with a formula:

$$L = C - N - 1, \text{ wherein}$$

L refers to the mantissa bit length of the second mantissa field, N refers to the exponent bit length, and C refers to the second bit length of the one or more second floating-point numbers.

20. The method of claim 16, wherein the determining the second sign bit comprises assigning a same value as the first sign bit to the second sign bit.

21. The method of claim 16, wherein the calculating the exponent value of the second exponent field comprises calculating the exponent value based on the first exponent field of a corresponding one of the one or more first floating-point numbers, an exponent bias of the one or more first floating-point numbers, and the base value stored in the base address register.

22. A method for converting floating-point numbers, comprising:
receiving one or more first floating-point numbers of a first bit length and a base value of the one or more first floating-point numbers, wherein each of the one or more first floating-point numbers includes a first sign bit, a first exponent field, and a first mantissa field, and wherein the base value is calculated based on a maximum value of the one or more first exponent fields and a minimum value of the one or more first exponent fields of the one or more first floating-point numbers; and calculating one or more second floating-point numbers of a second bit length based on the calculated base value, the one or more second floating-point numbers respectively corresponding to the one or more first floating-point numbers, wherein the first bit length of each of the one or more first floating-point numbers is less than the second bit length of each of the one or more floating-point numbers, and wherein each of the one or more second floating-point numbers includes a second sign bit, a second exponent field, and a second mantissa field.

23. The method of claim 22, wherein the calculating comprises determining a mantissa bit length of the second mantissa field and an exponent bit length of the second exponent field in accordance with a predetermined format of the one or more second floating-point numbers.

24. The method of claim 22, wherein the calculating comprises:

determining, by a sign controller, the second sign bit;

calculating, by a mantissa calculator, a mantissa value of the second mantissa field; and calculating, by an exponent calculator, an exponent value of the second exponent field.

25. The method of claim 24, wherein calculating the mantissa value of the second mantissa filed comprises assigning a same value as the corresponding first mantissa field to one or more most significant bits of the second mantissa field.

26. The method of claim 24, wherein the calculating the exponent value of the second exponent field comprises calculating the exponent value based on the first exponent field, an exponent bias of a corresponding one of the one or more first floating-point numbers, and the base value stored in the base address register.

* * * * *